(12) United States Patent
Zhou et al.

(10) Patent No.: US 10,680,211 B2
(45) Date of Patent: Jun. 9, 2020

(54) MOTHERBOARD SUBSTRATE, MOTHERBOARD PANEL, DISPLAY PANEL, MANUFACTURING METHOD THEREOF, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Changdu, Sichuan (CN)

(72) Inventors: Zhenli Zhou, Beijing (CN); Zhiliang Jiang, Beijing (CN); Yinan Liang, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 288 days.

(21) Appl. No.: 15/735,368

(22) PCT Filed: Jun. 21, 2017

(86) PCT No.: PCT/CN2017/089338
§ 371 (c)(1),
(2) Date: Dec. 11, 2017

(87) PCT Pub. No.: WO2018/024041
PCT Pub. Date: Feb. 8, 2018

(65) Prior Publication Data
US 2020/0035955 A1 Jan. 30, 2020

(30) Foreign Application Priority Data
Aug. 1, 2016 (CN) .......................... 2016 1 0622334

(51) Int. Cl.
*H01L 51/56* (2006.01)
*H01L 51/52* (2006.01)

(52) U.S. Cl.
CPC .......... *H01L 51/56* (2013.01); *H01L 51/5237* (2013.01); *H01L 2251/566* (2013.01)

(58) Field of Classification Search
CPC H01L 51/56; H01L 51/5237; H01L 2251/566
See application file for complete search history.

(56) References Cited

U.S. PATENT DOCUMENTS 9,379,353 B2 * 6/2016 Hsiao .................. H01L 51/5246
9,722,214 B2 * 8/2017 Sun ......................... H01L 51/56
(Continued)

FOREIGN PATENT DOCUMENTS

| CN | 103207480 A | 7/2013 |
| CN | 104064687 A | 9/2014 |

(Continued)

OTHER PUBLICATIONS

International Search Report and Written Opinion dated Sep. 27, 2017; PCT/CN2017/089338.
(Continued)

*Primary Examiner* — Zandra V Smith
*Assistant Examiner* — Andre C Stevenson

(57) ABSTRACT

A motherboard substrate, a motherboard panel, a display panel, a display device and a method for manufacturing the display panel are provided. The motherboard substrate comprises a plurality of display substrates arranged in an array and regions provided between adjacent display substrates. Each display substrate includes a region to be packaged; a first reflection structure is provided at the region to be packaged; a second reflection structure is provided on the outside of the display substrate and in the region between adjacent display substrates; and the second reflection struc- (Continued)

ture and the first reflection structure are spaced apart from each other.

16 Claims, 5 Drawing Sheets

(56) References Cited

U.S. PATENT DOCUMENTS

| | | |
|---|---|---|
| 2015/0296573 A1 | 10/2015 | Hsiao et al. |
| 2016/0164027 A1 | 6/2016 | Jeon |
| 2016/0329518 A1 | 11/2016 | Xiao |
| 2016/0329528 A1 | 11/2016 | Sun |
| 2017/0278831 A1 | 9/2017 | Li |

FOREIGN PATENT DOCUMENTS

| | | |
|---|---|---|
| CN | 104409662 A | 3/2015 |
| CN | 104576698 A | 4/2015 |
| CN | 104916662 A | 9/2015 |
| CN | 106025097 A | 10/2016 |
| WO | WO-2014153888 A1 * | 10/2014 |

OTHER PUBLICATIONS

The First Chinese Office Action dated May 26, 2017; Appln No. 201610622334.1.
The Second Chinese Office Action dated Oct. 26, 2017; Appln. No. 201610622334.1.

* cited by examiner

MOTHERBOARD SUBSTRATE, MOTHERBOARD PANEL, DISPLAY PANEL, MANUFACTURING METHOD THEREOF, AND DISPLAY DEVICE

CROSS REFERENCE TO RELATED APPLICATIONS

The application claims priority to the Chinese patent application No. 201610622334.1, filed on Aug. 1, 2016 on SIPO and entitled "Motherboard Substrate, Motherboard Panel, Display Panel, Manufacturing Method thereof and Display Device", which is incorporated herein by reference in its entirety.

TECHNICAL FIELD

Embodiments of the present disclosure relate to a motherboard substrate, a motherboard panel, a display panel, a manufacturing method thereof, and a display device.

BACKGROUND

Organic light-emitting diode (OLED) display has been listed as a very prospect next-generation display due to the advantages of light and thin design, wide viewing angle, active emission, continuous adjustability of luminous color, low cost, fast response, low power consumption, low driving voltage, wide operating temperature range, simple production processes, high luminous efficiency, flexible display, or the like.

SUMMARY

Embodiments of the present disclosure relates to a motherboard substrate, a motherboard panel, a display panel and a manufacturing method thereof, and a display device.

At least one embodiment of the present disclosure provides a motherboard substrate, comprising: a plurality of display substrates arranged in an array and regions between any adjacent display substrates. Each display substrate includes a region to be packaged; a first reflection structure is provided at the region to be packaged; a second reflection structure is provided on the outside of the display substrate, the second reflection structure and the first reflection structure being spaced apart from each other.

For example, the first reflection structure is a U-shaped reflection structure; and the region to be packaged of the display substrate is also provided with a wiring portion, the wiring portion being provided in an opening region of the U-shaped reflection structure.

For example, the U-shaped reflection structure includes a second reflection portion and a third reflection portion arranged oppositely to each other, and a first reflection portion provided between the second reflection portion and the third reflection portion, the first reflection portion being opposite to the wiring portion. The second reflection structure includes a fourth reflection portion, a fifth reflection portion and a sixth reflection portion. The fourth reflection portion is provided on the outside of the first reflection portion; the fifth reflection portion is provided on the outside of the second reflection portion, and the sixth reflection portion is provided on the outside of the third reflection portion.

For example, the width of the first reflection portion, the width of the second reflection portion, and the width of the third reflection portion is 200 μm-400 μm, respectively; and the width of the fourth reflection portion, the width of the fifth reflection portion, and the width of the sixth reflection portion is 50 μm-250 μm, respectively.

For example, the second reflection structure further includes a seventh reflection portion and an eighth reflection portion, the seventh reflection portion being provided on an outside of a corner formed by the first reflection portion and the second reflection portion, and the eighth reflection portion being provided on an outside of a corner formed by the first reflection portion and the third reflection portion.

For example, the second reflection structure is a metal strip structure.

For example, the second reflection structure includes a plurality of metal block structures arranged in an array.

For example, the metal block structure is a rectangular metal block structure, a circular metal block structure, or a triangular metal block structure.

For example, both the first reflection structure and the second reflection structure are made of molybdenum (Mo).

Embodiments of the present disclosure provide a motherboard panel, comprising the motherboard substrate and an opposite substrate connected with the motherboard substrate through sealant.

Embodiments of the present disclosure provide a display panel, which is prepared by cutting the motherboard panel.

Embodiments of the present disclosure provide a display device, comprising the display panel.

Embodiments of the present disclosure provide a method for manufacturing a display panel, comprising: forming a first reflection structure at a region to be packaged of each display substrate on a motherboard substrate; forming a second reflection structure on the outside of the display substrate, the second reflection structure being provided on the outside of the first reflection structure and spaced apart from the first reflection structure; coating sealant between the regions to be packaged and an opposed substrate, between the second reflection structures and the opposed substrate, and between gap parts on the motherboard substrate between the first reflection structures and the second reflection structures and the opposed substrate; sintering the sealant by a laser; scoring a cutting line on a side of the motherboard substrate away from the sealant, the path of the cutting line avoiding the first reflection structures and the second reflection structures; and applying a pressure to a surface of the cutting line to form the display panel after the splitting.

For example, the second reflection structure is a metal strip structure; scoring a cutting line on a side of the motherboard substrate away from the sealant, the path of the cutting line falls into gaps between the first reflection structures and the second reflection structures.

For example, the second reflection structure includes a plurality of metal block structures arranged in an array; scoring a cutting line on a side of the motherboard substrate away from the sealant, the path of the cutting line falling into gaps between the first reflection structures and the second reflection structures, or falling into gaps among the plurality of metal block structures.

BRIEF DESCRIPTION OF THE DRAWINGS

Embodiments of the present disclosure will be described in more detail below with reference to accompanying drawings to allow an ordinary skill in the art to more clearly understand embodiments of the present disclosure, in which.

DETAILED DESCRIPTION

Figure 1:
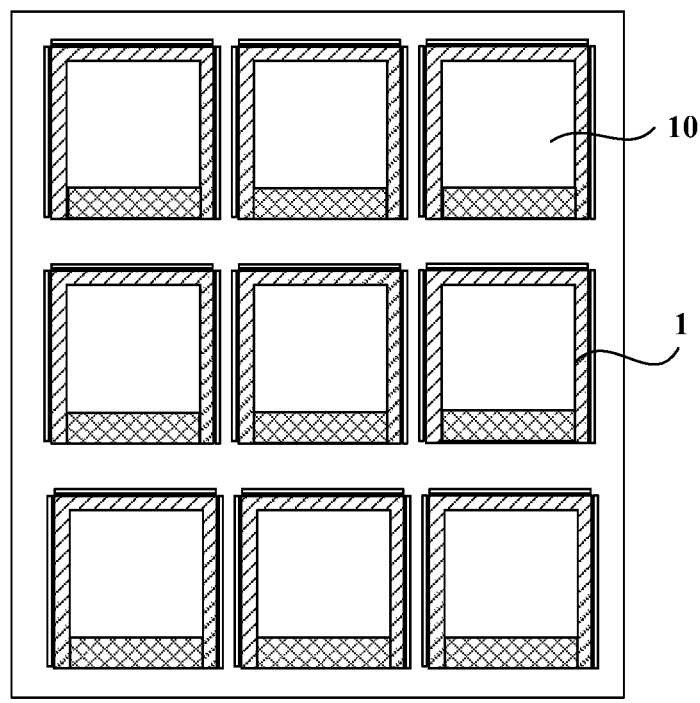
FIG. 1 is a schematic structural view of a motherboard substrate provided by the embodiment of the present disclosure.

Technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," "left," "right," or the like are only used to indicate relative position relationship, and when the position of the object which is described is changed, the relative position relationship may be changed accordingly.

An uncut OLED motherboard panel comprises a plurality of OLED display panels spaced apart from each other. Each OLED display panel comprises: an evaporation substrate, OLED elements disposed on the evaporation substrate, and a package substrate disposed above the evaporation substrate and opposite to the evaporation substrate. After the package process of the motherboard panel is completed, it is cut to separate the OLED display panels, the separated OLED display panels are the OLED display screens.

For the evaporation substrate of the OLED display panel, a region to be packaged 1 of the evaporation substrate includes a U-shaped metal structure formed by film coating process. The U-shaped metal structure includes a second metal portion and a third metal portion arranged oppositely to each other, and a first metal portion disposed between the second metal portion and the third metal portion. The opening region of the U-shaped metal structure is a wiring portion which is connected with a printed circuit board (PCB) or a flexible PCB. In the process of packaging the OLED display panel, it is needed to coat sealant at the region to be packaged of the package substrate, and the sealant is sintered by a laser sintering device to realize good package of the OLED display panel.

The inventors noticed that, to realize a narrow-bezel design of a display device, one technical proposal is that: the width of the first metal portion, the width of the second metal portion, and the width of the third metal portion of the U-shaped metal structure is made to be small. However, to ensure the package performance of the OLED display, the coating width of the sealant should be within a certain range, resulting in a situation that the coating width of the sealant must be greater than the width of the first metal portion, the width of the second metal portion, and the width of the third metal portion. When the sealant exceeding the outside of the U-shaped metal structure is subjected to laser sintering, as no metal portion in the exceeding region of the sealant reflects laser, effective sintering cannot be implemented. In the process of cutting the OLED display, the cutting effect of the OLED display will be greatly affected, and poor package effect of the OLED display can be caused.

To improve the cutting effect of the motherboard panel and improve the package effect of the display panel, and meanwhile, realize the narrow-bezel design of the display device, embodiments of the present disclosure provide a motherboard substrate, a motherboard panel, a display panel, a display device and a method for manufacturing the display panel.

Figure 2:
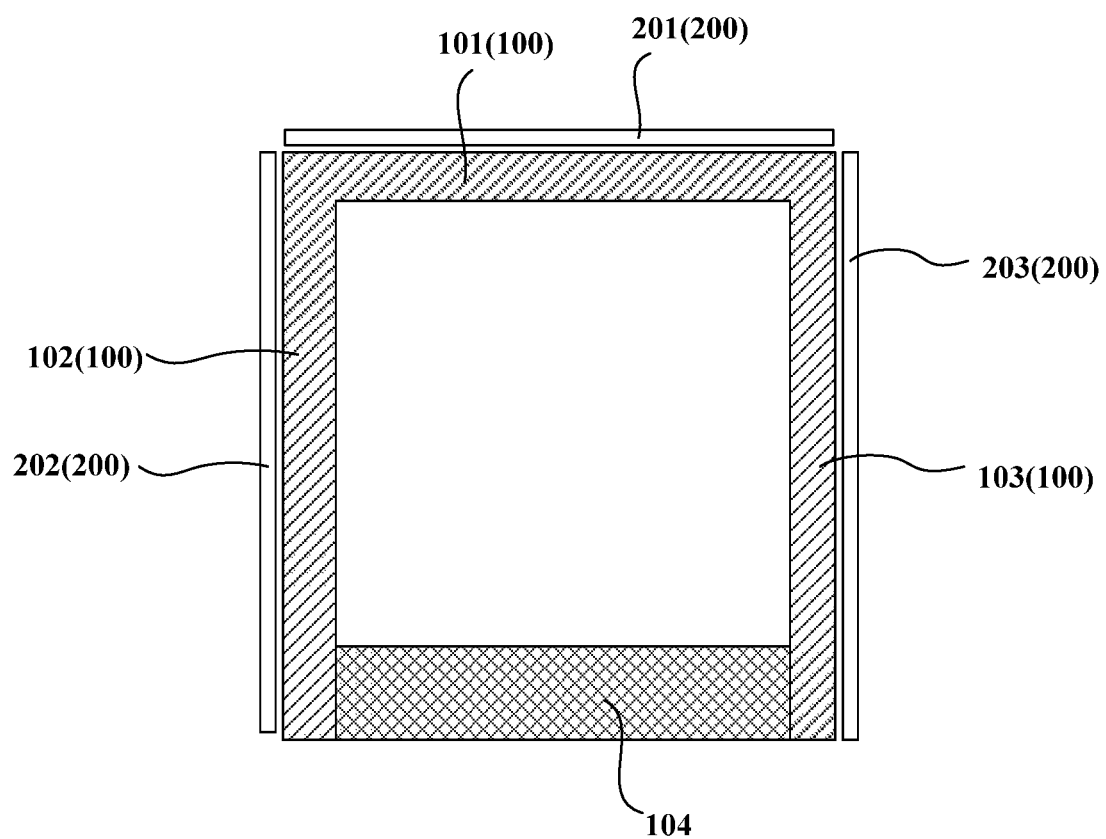
FIG. 2 is a sectional view of a display substrate and a second reflection structure disposed on the outside of the display substrate provided by an embodiment of the present disclosure.

As illustrated in FIG. 1, the embodiment of the present disclosure provides a motherboard substrate, which comprises a plurality of display substrates 10 arranged in an array and regions disposed on the outside of or among adjacent display substrates 10. As shown in FIG. 2, each display substrate 10 includes a region to be packaged; a first reflection structure 100 is disposed at the region to be packaged; a second reflection structure 200 is disposed in the region disposed on the outside of the display substrate 10 and between adjacent display substrates 10; and the second reflection structure 200 and the first reflection structure 100 are spaced apart from each other.

The first reflection structure 100 is configured to reflect light. For instance, the first reflection structure 100 may be a metal structure. When the first reflection structure 100 is a metal structure, the material of the first reflection structure, for instance, may be Molybdenum (Mo). Similarly, the second reflection structure 200 is also configured to reflect light. The second reflection structure 200, for instance, may be a metal structure. When the second reflection structure 200 is a metal structure, the material of the second reflection structure, for instance, may be Molybdenum (Mo).

In the technical proposal of the embodiment of the present disclosure, it is needed that the motherboard substrate is connected with an opposed substrate through sealant. The sealant is coated between the regions to be packaged of the motherboard substrate and the opposed substrate, between the second reflection structures and the opposed substrate, and between gap portions on the motherboard substrate between the first reflection structures and the second reflection structures and the opposed substrate. When the sealant is subjected to a laser sintering process, as both the first reflection structure and the second reflection structure can reflect the laser, the sealant at the above regions can obtain full laser exposure, so full sintering can be realized.

On the basis of the above principle, in the process of cutting a motherboard panel formed by the motherboard substrate and the opposed substrate connected with the motherboard substrate through the sealant, the path of a cutting line avoids the first reflection structures and the second reflection structures. In the process of applying a pressure to the motherboard panel along the cutting line, the motherboard panel can be easily separated to form a display panel. In this way, the cutting effect of the motherboard panel can be greatly improved, and good package effect of the display panel can be realized. Moreover, based on the above design, the width of the first reflection structure may be made to be narrow, so as to realize the narrow-bezel design of the display device.

Figure 3:
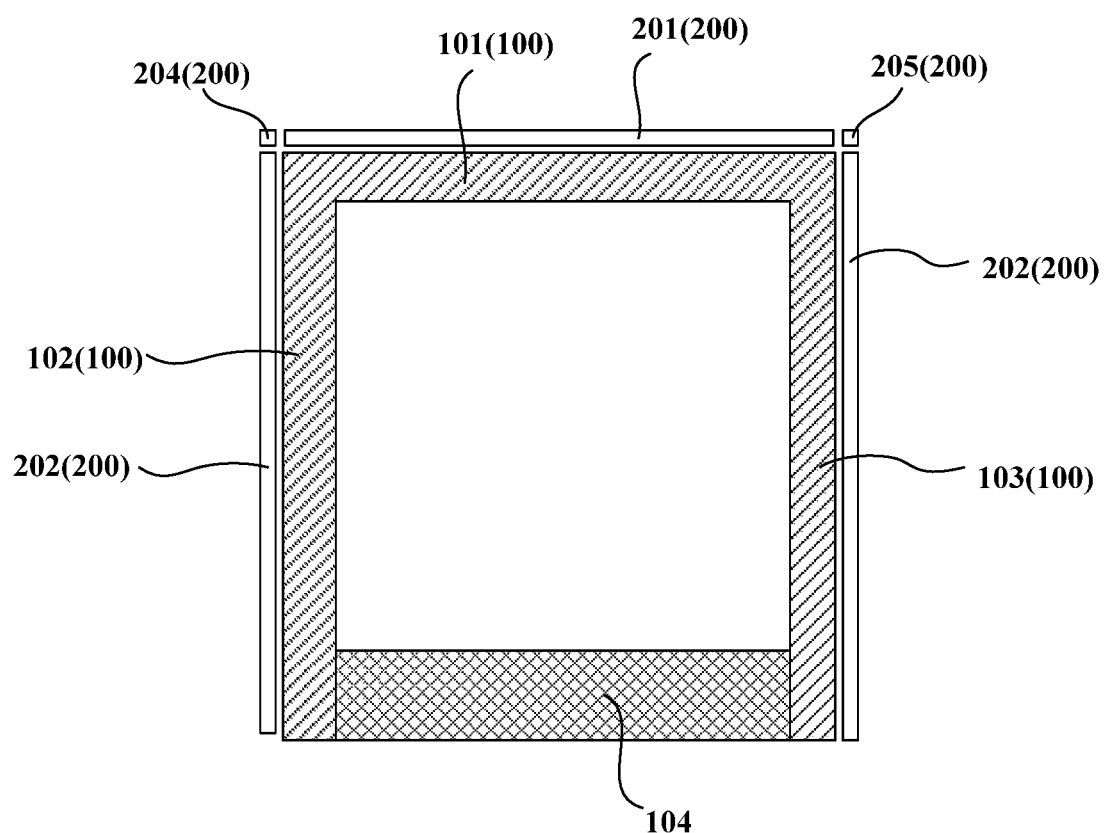
FIG. 3 is a sectional view of a display substrate and a second reflection structure disposed on the outside of the display substrate provided by another embodiment of the present disclosure.

In an exemplary embodiment of the present disclosure, as shown in FIGS. 2 and 3, the first reflection structure 100 is a U-shaped reflection structure. The region to be packaged of the display substrate also includes a wiring portion 104. The wiring portion 104 is disposed at the opening region of the U-shaped reflection structure. The wiring portion is connected with a PCB or a flexible PCB (not shown).

In the exemplary embodiment, the wiring portion is a metal wiring portion and the metal wiring portion can reflect the laser, the sealant coated between the wiring portions and the opposed substrate can be fully sintered.

For instance, as shown in FIG. 2, the first reflection structure 100 includes a second reflection portion 102 and a third reflection portion 103 arranged oppositely to each other, and a first reflection portion 101 disposed between the second reflection portion 102 and the third reflection portion 103. The first reflection portion is opposite to the wiring portion. The second reflection structure 200 includes a fourth reflection portion 201, a fifth reflection portion 202 and a sixth reflection portion 203.

The fourth reflection portion 201 is disposed on the outside of the first reflection portion 101; the fifth reflection portion 202 is disposed on the outside of the second reflection portion 102; and the sixth reflection portion 203 is disposed on the outside of the third reflection portion 103.

In the embodiment of the present disclosure, in the region to be packaged of the display substrate, a side opposite to the side of the wiring portion 104 is a first side, and two sides adjacent to the first side are respectively a second side and a third side. As shown in FIG. 2, in the embodiment, the first reflection portion 101 is disposed on the first side; the second reflection portion 102 is disposed on the second side; the third reflection portion 103 is disposed on the third side; correspondingly, the fourth reflection portion 201 is disposed on the outside of the first side; the fifth reflection portion 202 is disposed on the outside of the second side; and the sixth reflection portion 203 is disposed on the outside of the third side.

It should be noted that the opposite position described above refers to that orthographic projections of corresponding parts on the motherboard substrate are parallel to each other.

The width of the first reflection portion 101, the width of the second reflection portion 102, and the width of the third reflection portion 103 may be varied. Considering the narrow-bezel design of the display device, for instance, the width of the first reflection portion 101, the width of the second reflection portion 102, and the width of the third reflection portion 103 is 200 μm-400 μm. To ensure good package effect of the display panel, the coating width of the sealant is generally about 450 μm. In this way, the width of the fourth reflection portion 201, the width of the fifth reflection portion 202, and the width of the sixth reflection portion 203 is 50 μm-250 μm. The coating width of the sealant may be changed. To realize the narrow-bezel design of the display device, the coating width of the sealant may be narrower, for instance, is 350 mm-450 mm. In this case, the width of the first reflection structure 100, and the width of the second reflection structure 200 will also be correspondingly adjusted.

In an exemplary embodiment of the present disclosure, as shown in FIG. 3, the second reflection structure 200 also includes a seventh reflection portion 204 and an eighth reflection portion 205. The seventh reflection portion 204 is disposed on the outside of a corner formed by the first reflection portion 101 and the second reflection portion 102. The eighth reflection portion 205 is disposed on the outside of a corner formed by the first reflection portion 101 and the third reflection portion 103. By this design, the second reflection structure has stronger reflection effect on the laser, so the sealant can be more fully sintered. In this way, the cutting effect of the motherboard panel can be better, so the package effect can also be better.

In the above embodiments, the shape of the second reflection structure 200, for instance, may be a metal strip structure, or include a plurality of metal block structures arranged in an array, but the embodiment of the present disclosures are not limited thereto.

In the embodiment as shown in FIGS. 2 and 3, the second reflection structure 200 is a metal strip structure. In the process of cutting the motherboard panel formed by the motherboard substrate and the opposed substrate connected with the motherboard substrate through the sealant, the path of the cutting line falls into gaps between the first reflection structures and the metal strip structures. The sealant connected with the first reflection structures, the metal strip structures and regions between the first reflection structures and the metal strip structures can be fully sintered, in the process of applying a pressure along the extension direction of the cutting line, the display panel can be easily separated from the motherboard panel, so the cutting effect of the motherboard panel during cutting is good.

Figure 4:
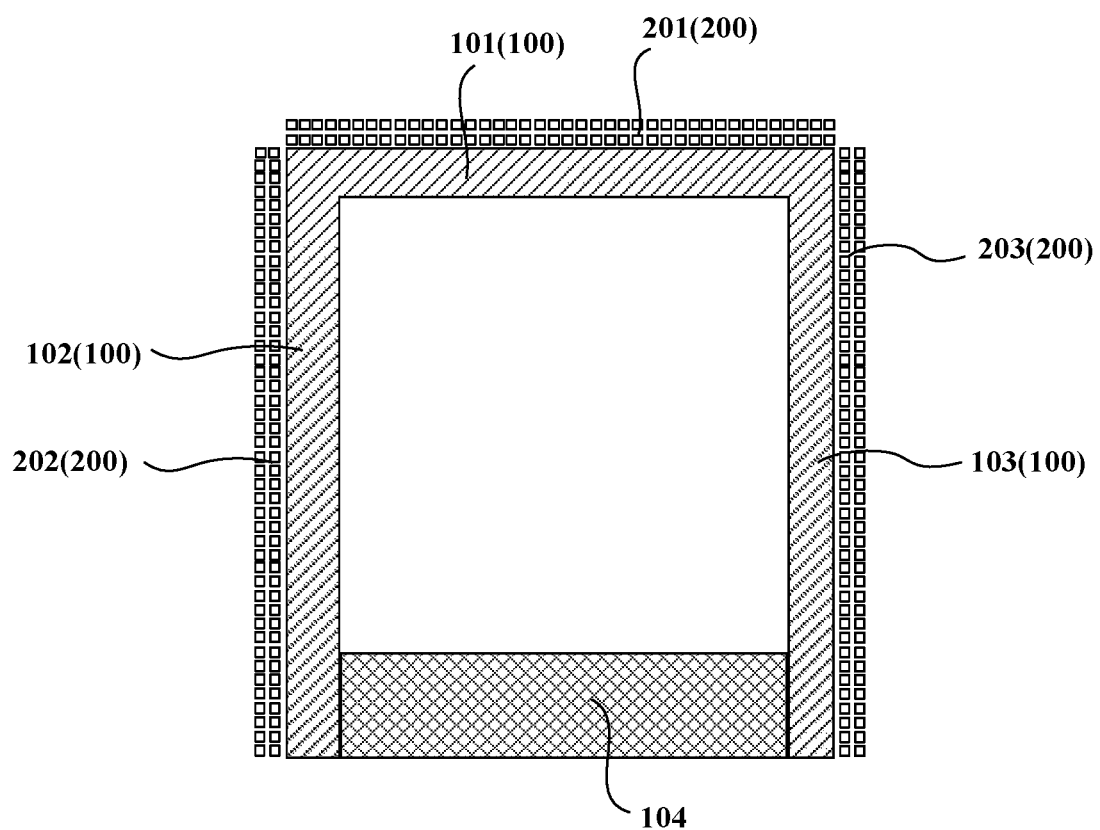
FIG. 4 is a sectional view of a display substrate and a second reflection structure disposed on the outside of the display substrate provided by still another embodiment of the present disclosure.

In the embodiment as shown in FIG. 4, the second reflection structure 200 includes a plurality of metal block structures arranged in an array. The shape of the metal block structures, for instance, may be a rectangular, a circular, or a triangular, but the embodiments of the present disclosure are not limited thereto. In the process of cutting the motherboard panel formed by the motherboard substrate and the opposed substrate connected with the motherboard substrate through the sealant, the cutting path falls into gaps between the first reflection structures and the second reflection structures or falls into gaps among the plurality of metal block structures. The sealant connected with the first reflection structures, the plurality of metal block structures, the gaps among the plurality of metal block structures and gap parts between the first reflection structures and the plurality of metal block structures can be fully sintered, in the process of applying a pressure along the extension direction of the cutting line, the display panel can be easily separated from the motherboard panel, so the cutting effect of the motherboard panel during cutting is good.

An embodiment of the present disclosure provides a motherboard panel, which comprises the motherboard substrate and an opposed substrate connected with the motherboard substrate through sealant. The cutting effect of the motherboard panel is good.

An embodiment of the present disclosure provides a display panel, which is cut from the motherboard panel. The cutting effect of the motherboard panel is good, and the package effect of the display panel is also good.

An embodiment of the present disclosure provides a display device, which comprises the display panel. The display device, for instance, may be a product or a component, such as a mobile phone, a tablet PC, a TV, a display, a notebook computer, a digital picture frame, or a navigator. The display device can realize narrow-bezel design.

Figure 5:
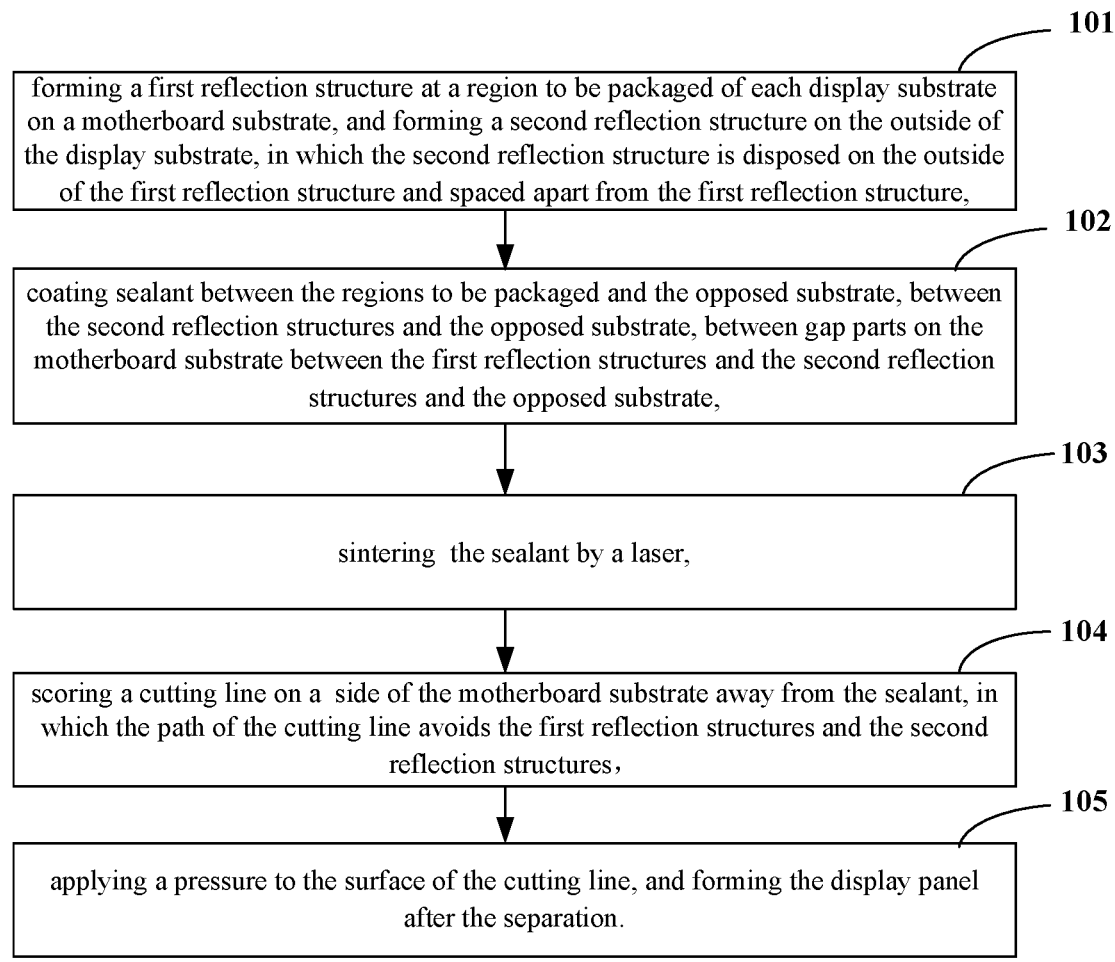
FIG. 5 is a flow diagram of a method for manufacturing a display panel provided by an embodiment of the present disclosure.

As illustrated in FIG. 5, an embodiment of the present disclosure also provides a method for manufacturing a display panel, which comprises following operations.

S101: forming a first reflection structure at a region to be packaged of each display substrate on a motherboard substrate, and forming a second reflection structure on the outside of the display substrate, in which the second reflection structure is disposed on the outside of the first reflection structure and spaced apart from the first reflection structure.

S102: coating sealant between the regions to be packaged and the opposed substrate, between the second reflection structures and the opposed substrate, between gap parts on the motherboard substrate between the first reflection structures and the second reflection structures and the opposed substrate.

S103: sintering the sealant by laser.

S104: scoring a cutting line on a side of the motherboard substrate away from the sealant, in which the path of the cutting line avoids the first reflection structures and the second reflection structures.

S105: applying a pressure to a surface of the cutting line to form the display panel after the separation operation.

In the step S104, the case that the path of the cutting line avoids the first reflection structures and the second reflection structures is mainly described in the following two embodiments:

In one embodiment, the second reflection structure is a metal strip structure. In the embodiment, the case that the path of the cutting line avoids the first reflection structures and the second reflection structures refers to that the path of the cutting line falls into gaps between the first reflection structures and the second reflection structures.

In another embodiment, the second reflection structure includes a plurality of metal block structures arranged in an array. In the embodiment, the case that the path of the cutting line avoids the first reflection structures and the second reflection structures refers to that the path of the cutting line falls into gaps between the first reflection structures and the second reflection structures, or falls into gaps among the plurality of metal block structures.

The display panel manufactured by the above method has good cutting effect and has good package effect. Meanwhile, the width of the first reflection structure can be narrow, so as to realize the narrow-bezel design of the display panel.

The described above are only exemplary embodiments of the present disclosure and not intended to limit the present disclosure. For one of ordinary skill in the art, modifications, and alternations may be readily contemplated without departing from the technical scope of the present disclosure, and all of these modifications and alternations shall fall within the scope of the present disclosure.

What is claimed is:

1. A motherboard substrate, comprising:
a plurality of display substrates arranged in an array, wherein each display substrate includes a region to be packaged; a first reflection structure is provided at the region to be packaged; and a second reflection structure is provided on the outside of the display substrate, the second reflection structure and the first reflection structure being spaced apart from each other;
wherein the first reflection structure is a U-shaped reflection structure; and the region to be packaged of the display substrate is provided with a wiring portion, the wiring portion being provided in an opening region of the U-shaped reflection structure, the U-shaped reflection structure including a second reflection portion and a third reflection portion arranged oppositely to each other, and a first reflection portion provided between the second reflection portion and the third reflection portion, the first reflection portion being opposite to the wiring portion, and the second reflection structure including a fourth reflection portion, a fifth reflection portion and a sixth reflection portion, the fourth reflection portion being provided on the outside of the first reflection portion, the fifth reflection portion being provided on the outside of the second reflection portion, and the sixth reflection portion being provided on the outside of the third reflection portion, and wherein the width of the first reflection portion, the width of the second reflection portion, and the width of the third reflection portion is 200 µm-400 µm, respectively; and the width of the fourth reflection portion, the width of the fifth reflection portion, and the width of the sixth reflection portion is 50 µm-250 µm, respectively.

2. The motherboard substrate according to claim 1, wherein the second reflection structure further includes a seventh reflection portion and an eighth reflection portion, the seventh reflection portion being provided on an outside of a corner formed by the first reflection portion and the second reflection portion, and the eighth reflection portion being provided on an outside of a corner formed by the first reflection portion and the third reflection portion.

3. The motherboard substrate according to claim 1, wherein the second reflection structure is a metal strip structure.

4. The motherboard substrate according to claim 1, wherein the second reflection structure includes a plurality of metal block structures arranged in an array.

5. The motherboard substrate according to claim 4, wherein the metal block structure is a rectangular metal block structure, a circular metal block structure, or a triangular metal block structure.

6. The motherboard substrate according to claim 1, wherein both the first reflection structure and the second reflection structure are made of molybdenum (Mo).

7. A motherboard panel, comprising a motherboard substrate and an opposite substrate connected with the motherboard substrate through sealant, wherein the motherboard substrate comprises a plurality of display substrates arranged in an array, wherein each display substrate includes a region to be packaged; a first reflection structure is provided at the region to be packaged; and a second reflection structure is provided on the outside of the display substrate, the second reflection structure and the first reflection structure being spaced apart from each other;
wherein the first reflection structure is a U-shaped reflection structure; and the region to be packaged of the display substrate is provided with a wiring portion, the wiring portion being provided in an opening region of the U-shaped reflection structure, the U-shaped reflection structure including a second reflection portion and a third reflection portion arranged oppositely to each other, and a first reflection portion provided between the second reflection portion and the third reflection portion, the first reflection portion being opposite to the wiring portion, and the second reflection structure including a fourth reflection portion, a fifth reflection portion and a sixth reflection portion, the fourth reflection portion being provided on the outside of the first reflection portion, the fifth reflection portion being provided on the outside of the second reflection portion, and the sixth reflection portion being provided on the outside of the third reflection portion, and wherein the width of the first reflection portion, the width of the second reflection portion, and the width of the third reflection portion is 200 μm-400 μm, respectively; and the width of the fourth reflection portion, the width of the fifth reflection portion, and the width of the sixth reflection portion is 50 μm-250 μm, respectively.

8. A display panel, which is prepared by cutting from the motherboard panel according to claim 7.

9. A display device, comprising the display panel according to claim 8.

10. A method for manufacturing a display panel, comprising:
- forming a first reflection structure at a region to be packaged of each display substrate on a motherboard substrate;
- forming a second reflection structure on the outside of the display substrate, the second reflection structure being provided on the outside of the first reflection structure and spaced apart from the first reflection structure;
- coating sealant between the regions to be packaged and an opposed substrate, between the second reflection structures and the opposed substrate, and between gap parts on the motherboard substrate between the first reflection structures and the second reflection structures and the opposed substrate;
- sintering the sealant by a laser;
- scoring a cutting line on a side of the motherboard substrate away from the sealant, the path of the cutting line avoiding the first reflection structures and the second reflection structures; and
- applying a pressure to a surface of the cutting line to form the display panel after the splitting;
- wherein the first reflection structure is a U-shaped reflection structure; and the region to be packaged of the display substrate is provided with a wiring portion, the wiring portion being provided in an opening region of the U-shaped reflection structure, the U-shaped reflection structure including a second reflection portion and a third reflection portion arranged oppositely to each other, and a first reflection portion provided between the second reflection portion and the third reflection portion, the first reflection portion being opposite to the wiring portion, and the second reflection structure including a fourth reflection portion, a fifth reflection portion and a sixth reflection portion, the fourth reflection portion being provided on the outside of the first reflection portion, the fifth reflection portion being provided on the outside of the second reflection portion, and the sixth reflection portion being provided on the outside of the third reflection portion, and wherein the width of the first reflection portion, the width of the second reflection portion, and the width of the third reflection portion is 200 μm-400 μm, respectively; and the width of the fourth reflection portion, the width of the fifth reflection portion, and the width of the sixth reflection portion is 50 μm-250 μm, respectively.

11. The manufacturing method according to claim 10, wherein the second reflection structure is a metal strip structure; and
the path of the cutting line scored on the side of the motherboard substrate away from the sealant falls into gaps between the first reflection structures and the second reflection structures.

12. The manufacturing method according to claim 10, wherein the second reflection structure includes a plurality of metal block structures arranged in an array; and the path of the cutting line scored on the side of the motherboard substrate away from the sealant falls into gaps between the first reflection structures and the second reflection structures, or falls into gaps among the plurality of metal block structures.

13. The motherboard panel according to claim 7, wherein the second reflection structure is a metal strip structure.

14. The motherboard panel according to claim 7, wherein the second reflection structure includes a plurality of metal block structures arranged in an array.

15. The motherboard panel according to claim 7, wherein both the first reflection structure and the second reflection structure are made of molybdenum (Mo).

16. The motherboard panel according to claim 7, wherein the second reflection structure further includes a seventh reflection portion and an eighth reflection portion, the seventh reflection portion being provided on an outside of a corner formed by the first reflection portion and the second reflection portion, and the eighth reflection portion being provided on an outside of a corner formed by the first reflection portion and the third reflection portion.

* * * * *